(12) United States Patent
Kim

(10) Patent No.: US 8,810,010 B2
(45) Date of Patent: Aug. 19, 2014

(54) SEMICONDUCTOR DEVICE AND METHOD FOR FABRICATING THE SAME

(71) Applicant: SK hynix Inc., Icheon (KR)

(72) Inventor: Jae Bum Kim, Seoul (KR)

(73) Assignee: SK Hynix Inc., Icheon (KR)

( * ) Notice: Subject to any disclaimer, the term of this patent is extended or adjusted under 35 U.S.C. 154(b) by 0 days.

(21) Appl. No.: 13/719,099

(22) Filed: Dec. 18, 2012

(65) Prior Publication Data
US 2014/0061874 A1    Mar. 6, 2014

(30) Foreign Application Priority Data
Aug. 30, 2012    (KR) .................. 10-2012-0095894

(51) Int. Cl.
H01L 29/06    (2006.01)
H01L 23/48    (2006.01)
H01L 21/48    (2006.01)

(52) U.S. Cl.
CPC ..... *H01L 23/481* (2013.01); *H01L 2224/06181* (2013.01); *H01L 2224/13023* (2013.01); *H01L 21/486* (2013.01); *H01L 2224/0557* (2013.01)

USPC ........... 257/653; 257/774; 257/E33.051; 257/E33.065; 257/E33.066

(58) Field of Classification Search
CPC ............ H01L 23/481; H01L 23/585; H01L 2225/06541
USPC ................................. 257/653, 774
See application file for complete search history.

(56) References Cited

U.S. PATENT DOCUMENTS

| | | | | |
|---|---|---|---|---|
| 7,968,460 | B2 * | 6/2011 | Kirby et al. | 438/667 |
| 8,164,113 | B2 * | 4/2012 | Lin et al. | 257/173 |
| 8,525,296 | B1 * | 9/2013 | Lin et al. | 257/532 |
| 2009/0085165 | A1 * | 4/2009 | Hiramatsu et al. | 257/615 |
| 2010/0224876 | A1 * | 9/2010 | Zhu | 257/52 |
| 2011/0260330 | A1 * | 10/2011 | Seo et al. | 257/774 |
| 2011/0304010 | A1 * | 12/2011 | Jiang et al. | 257/528 |
| 2011/0304999 | A1 * | 12/2011 | Yu et al. | 361/783 |
| 2012/0061789 | A1 * | 3/2012 | Yang et al. | 257/443 |
| 2012/0091520 | A1 * | 4/2012 | Nakamura | 257/303 |
| 2012/0298410 | A1 * | 11/2012 | Lu et al. | 174/264 |

* cited by examiner

Primary Examiner — A. Sefer

(57) ABSTRACT

An exemplary semiconductor device comprises a through silicon via penetrating a semiconductor substrate including a circuit pattern on one side of the substrate, a first doped layer formed in the other side, and a bump connected with the through silicon via.

7 Claims, 11 Drawing Sheets

1

SEMICONDUCTOR DEVICE AND METHOD FOR FABRICATING THE SAME

CROSS-REFERENCE TO RELATED APPLICATION

The present application claims priority to Korean patent application No. 10-2012-0095894 filed on Aug. 30, 2012, which is incorporated by reference in its entirety.

BACKGROUND OF THE INVENTION

The present invention relates generally to a semiconductor device and a method for fabricating the same, and more particularly to a technology for preventing a short phenomenon between a bump and a silicon (Si) of a semiconductor substrate during a through silicon via (TSV) process.

A three-dimensional stacking technique has been developed as a packaging technique in order to enhance a packaging density while reducing the size and improving performance of semiconductor devices. A three-dimensional stacking package is made by stacking a plurality of chips having the same memory capacity, which is referred to herein as a stacked chip package.

Mass production can lower the manufacturing cost of fabricating stacked chip packages. Initial use of the stacked packaging technique used wiring outside of the chip areas to connect stacked chips.

That is, chip layers in a conventional stacked chip packages are connected through wires coupled between a bonding pad of each chip and a conductive circuit pattern of a substrate while a plurality of chips are attached to a chip adhesion region of the substrate. As a result, a space for wire bonding is required, and a circuit pattern area of the substrate connected with the wire is also required so that the size of the semiconductor package is increased.

To overcome these size constraints, a structure using a through silicon via has been developed. After a through silicon via is formed within each chip in a bar wafer step, vertical physical and electrical connection between chips is facilitated by the through silicon via.

In a conventional process of forming a through silicon via, after a vertical hole is formed in a semiconductor substrate to obtain the through silicon via, the through silicon via is exposed by back-grinding the rear surface of the semiconductor substrate.

After the semiconductor substrate is separated into individual chips by sawing, at least two or more chips are vertically stacked over the semiconductor substrate so that signals may be exchanged through a conductive metal of the through silicon vias. The upper surface of the semiconductor substrate including the stacked chips is molded, and a shoulder ball is mounted on the lower surface of the semiconductor substrate, thereby completing the stacked package.

However, when a bump and a metal line connected with the through silicon via are formed, a contact surface between the bump and adjacent silicon may become misaligned, which results in a short.

BRIEF SUMMARY OF THE INVENTION

Various embodiments of the present invention are directed to forming an N/P junction in a semiconductor substrate to get a reverse bias in order to prevent a short between a bump and silicon of the semiconductor substrate during a process for forming a bump. According to one aspect of an exemplary embodiment of the present invention, a semiconductor device comprises: a semiconductor substrate having a first conductivity; a plurality of metal lines disposed on a first side of the semiconductor substrate; a through silicon via penetrating the semiconductor substrate; a first doped layer disposed into a second side of the semiconductor substrate has a second conductivity by an ion-implanted; and a bump disposed on the second side of the semiconductor substrate and coupled to the through silicon via. The first doped layer includes a different type and concentration of impurities from the semiconductor substrate. The substrate includes P-type impurities and the first doped layer includes N-type impurities. A positive (+) back bias voltage (VBB) is applied to the semiconductor substrate. A width of the bump is larger than a width of the through silicon via. The semiconductor device may further include a second doped layer disposed on the first doped layer and having the first conductivity.

The substrate and the second doped layer include P-type impurities and the first doped layer includes N-type impurities. A negative (−) back bias voltage (VBB) is applied to the semiconductor substrate. The bump is formed on the second doped layer. The semiconductor device may further include an insulating film formed on the second doped layer.

According to another aspect of an exemplary embodiment of the present invention, a method for fabricating a semiconductor device comprises: forming a through silicon via in a semiconductor substrate doped with impurities of a first type; implanting impurities of a second type into an outer surface of the semiconductor substrate disposed around of the through silicon via to form a first doped layer; and forming a bump on the through silicon via.

The method first type impurities are P type and the second type of impurities are N type. The bump is coupled to the first layer. The method may further include implanting impurities of the first type into an outer surface of the first doped layer to form a second doped layer.

The method may further include forming a second doped layer implanted with impurities of the first type on an outer portion of the first doped layer. The method may further include attaching a second doped layer implanted with impurities of the first type to the outer portion of the first doped layer.

The method may further include patterning an insulating film on the second doped layer to expose the through silicon via. The method impurities of the second type are N type, and the impurities of the first type impurities are P type.

The method may further include forming an insulating film on the first doped layer to expose the through silicon via.

BRIEF DESCRIPTION OF THE DRAWINGS

The above and other aspects, features and advantages of the subject matter of the present disclosure will be more clearly understood from the following detailed description taken in conjunction with the accompanying drawings, in which.

DESCRIPTION OF EMBODIMENTS

Figure 1:
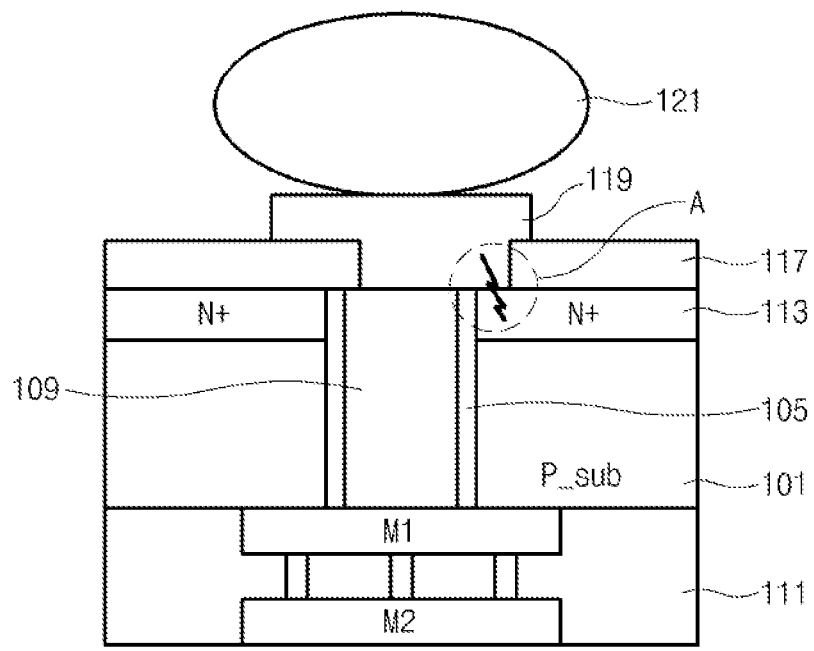
FIG. 1 illustrates a cross-sectional view of a semiconductor device according to an embodiment of the present invention.

Embodiments are described herein with reference to cross-sectional illustrations that are schematic illustrations of exemplary embodiments (and intermediate structures). As such, variations from the shapes of the illustrations as a result, for example, of manufacturing techniques and/or tolerances, are to be expected. Thus, exemplary embodiments of the present invention should not be construed as being limited to the particular shapes of regions illustrated herein, but may include deviations in shapes that result, for example, from manufacturing. In the drawings, lengths and sizes of layers and regions may be exaggerated for clarity. Like reference numerals in the drawings denote like elements. In the following specification and claims, the term "on" does not necessarily imply a particular orientation such as which side is "up" and which side is "down." When an element is described as being "on" another element, it is possible that other intervening layers, substances, or structures may be disposed between the elements.

FIG. 1 illustrates a cross-sectional view of a semiconductor device according to an embodiment of the present invention.

Referring to FIG. 1, the semiconductor device comprises a P-type semiconductor substrate 101 including oxide films 105 formed over sidewalls of a through silicon via 109 in order to prevent CU migration. An N-type ion-implanting region 113 is formed over the P-type semiconductor substrate 101. An insulating film 117 is formed over the N-type ion-implanting region 113. A bump 119 is disposed between the insulating films 117 and connected with the through silicon via 109. A ball 121 for electrical connection is formed over the bump 119. In the semiconductor device of FIG. 1, an interlayer insulating film 111 including semiconductor metal lines M1 and M2 is formed below the semiconductor substrate 101.

As shown in FIG. 1, when the bump 119 is misaligned so that it is connected with the N-type ion-implanting region 113 (as shown by "A" of FIG. 1), the interface between the P-type semiconductor substrate 101 and the N-type ion-implanting region 113 is a PN junction so that current flows from the P-type semiconductor substrate 101 to the N-type ion-implanting region 113. Because current does not flow from the N-type ion-implanting region 113 to the P-type semiconductor substrate 101, a short between the bump 119 and the semiconductor substrate 101 can be prevented.

The above bias operation of the PN junction will now be described in more detail.

A PN junction exists when a region implanted with P-type ions having a high concentration of holes to have a first conductivity is connected with a region implanted with N-type ions having a high concentration of carriers to have a second conductivity. When a positive (+) voltage is applied to the P-type ion-implanting region and a negative (−) voltage is applied to the N-type ion-implanting region, a forward direction bias is applied, which results in a diffusion phenomenon. The holes of the P-type ion-implanting region move to the N-type ion-implanting region, and the carriers of the N-type ion-implanting region move to the P-type ion-implanting region. As a result, since the size of the depletion zone is reduced, current flows from the P-type ion-implanting region to the N-type ion-implanting region in a direction opposite to the movement of carriers.

In the semiconductor device of FIG. 1, since the N-type ion-implanting region 113 is formed over the P-type semiconductor substrate 101, current flows from the P-type semiconductor substrate 101 to the N-type ion-implanting region 113 when a positive (+) back bias voltage (VBB) is applied to the semiconductor substrate 101.

Thus, when the bump 119 is misaligned so that it is connected with the N-type ion-implanting region 113, current does not flow from the N-type ion-implanting region 113 to the P-type semiconductor substrate 101. As a result, a leakage current from the bump 119 does not flow through the N-type ion-implanting region 113 to the semiconductor substrate 101, thereby preventing the short between the bump 119 and the semiconductor substrate 101.

FIGS. 2a to 2k illustrate cross-sectional views of a method for fabricating the semiconductor device of FIG. 1.

Figure 2A:
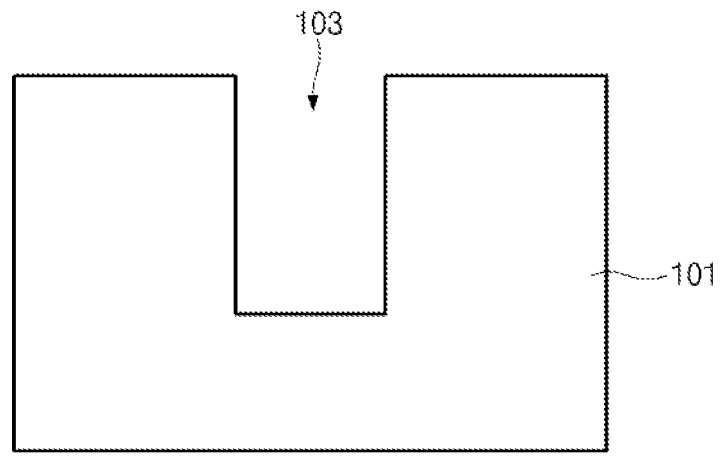
FIGS. 2a to 2k illustrate cross-sectional views of a method for fabricating the semiconductor device of FIG. 1.

Referring to FIG. 2a, the semiconductor substrate 101 including a transistor (not shown) is etched to form a vertical hole 103.

Figure 2B:
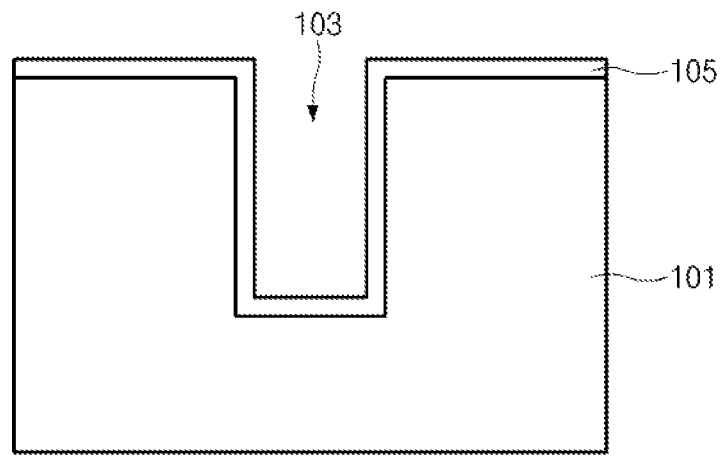

Referring to FIG. 2b, an oxide film 105 having a given thickness is formed over the semiconductor substrate 101 along a step difference in the vertical hole 103. In other words, oxide film 105 is formed over the bottom and sidewalls of hole 103, as well as the upper surface of substrate 100.

Figure 2C:
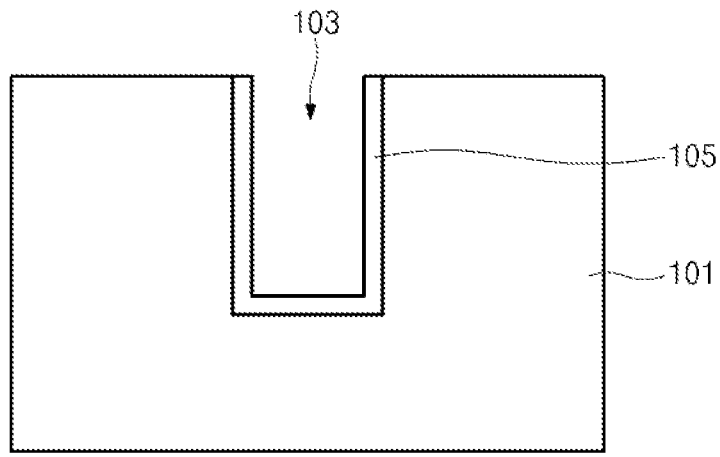

Referring to FIG. 2c, the oxide film 105 is planarized to expose the upper portion of the semiconductor substrate 101 while leaving portions of oxide film 105 disposed on the bottom and sidewalls of the vertical hole 103. The planarizing process may be performed by a chemical mechanical polishing (CMP) process or an etching process.

Figure 2D:
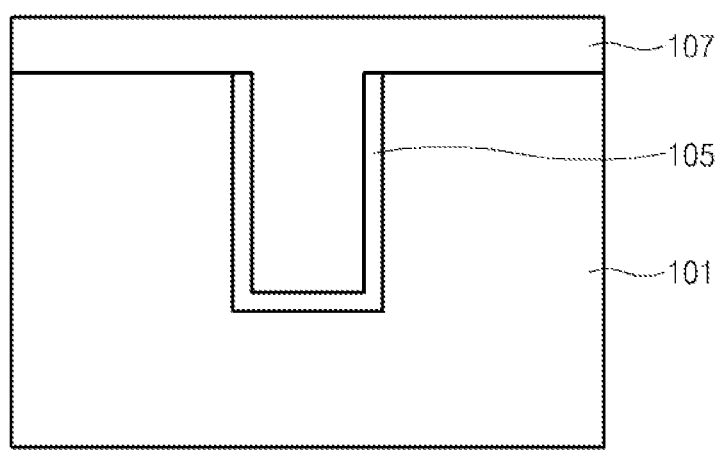

Referring to FIG. 2d, a metal seed (not shown) is formed in the vertical hole 103, and a conductive material 107 is formed in the vertical hole 103 and over upper surfaces of the semiconductor substrate 101 using the metal seed. The metal seed may include copper (Cu), and the forming of the metal seed may be performed by a sputtering method. The forming of the conductive material 107 may be performed by an electroplating method.

Figure 2E:
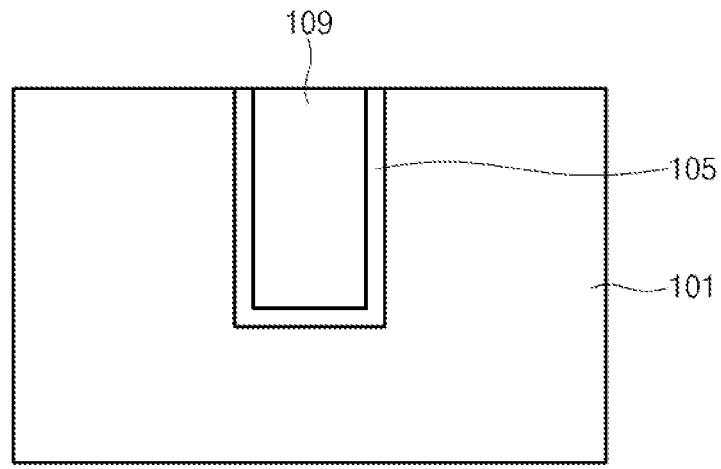

Referring to FIG. 2e, the conductive material 107 is planarized so that only conductive material 107 disposed in the vertical hole 103 remains, thereby obtaining a through silicon via 109. An annealing process may be performed on the through silicon via 109 at a temperature of about 100° C. to improve a characteristic of the through silicon via 109.

Figure 2F:
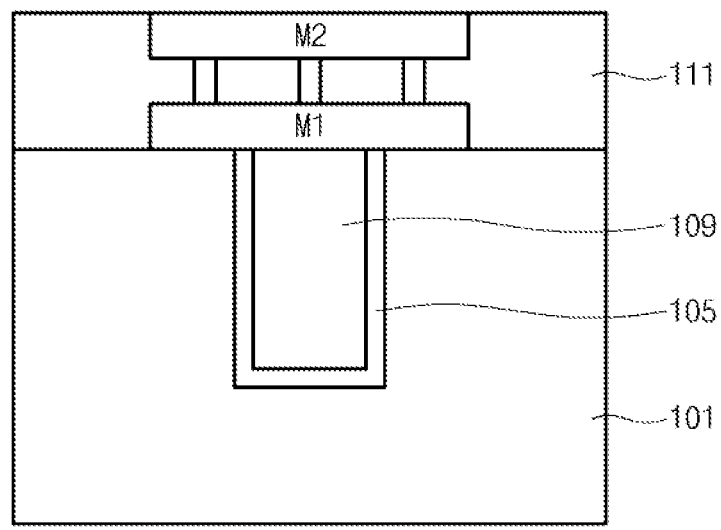

Referring to FIG. 2f, the interlayer insulating film 111 is formed over the semiconductor substrate 101 including the through silicon via 109, and a photoresist film (not shown) is formed over the interlayer insulating film 111. An exposing and developing process is performed with a metal line mask to form a photoresist pattern (not shown). The interlayer insulating film 111 may include an oxidized material. The interlayer insulating film 111 is etched with the photoresist pattern as an etching mask, and a metal material is buried to form metal lines M1 and M2 connected with the through silicon via 109. The metal lines M1 and M2 can be connected with the bump through TSV 109 so that the chip can be connected to another separate chip in a stacked chip package.

The interlayer insulating film 111 is planarized to expose the upper portion of the metal line M2.

Figure 2G:
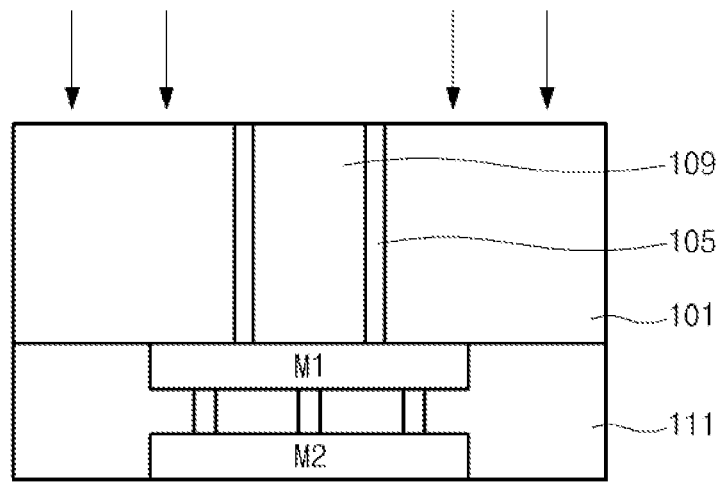

Referring to FIG. 2g, the exposed surface of the semiconductor substrate 101 is etched to expose an upper portion of the through silicon via 109. For the grinding of the exposed surface of the semiconductor substrate 101, a carrier substrate (not shown) connected with the metal line M2 of the semiconductor substrate 101 may be attached. The carrier substrate is used to locate an support the semiconductor substrate during the grinding process.

FIGS. 2h to 2k show an inverted orientation where the exposed surface of semiconductor substrate 101 faces upwards.

Figure 2H:
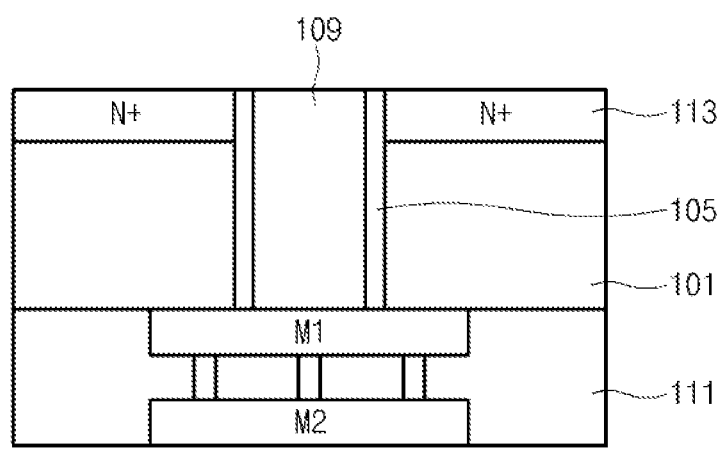

Referring to FIG. 2h, the N-type ion-implanting regions 113 are formed in an upper layer of semiconductor substrate 101 on both sides of the through silicon via 109. Although the term "upper" is used here to describe an orientation with respect to FIG. 2h, the chip may be inverted in a final assembly so that balls 121 are disposed on a "lower" surface of a semiconductor. Thus, in the following specification and claims, an exposed or outermost surface of an embodiment may be referred to as an "outer" surface.

The N-type ion-implanting region 113 can be formed by implanting N-type impurities into the exposed rear surface of the semiconductor substrate 101 of FIG. 2g, or by stacking or attaching an N-type ion-implanting layer implanted with N-type impurities onto the exposed surface of the semiconductor substrate 101.

Figure 2I:
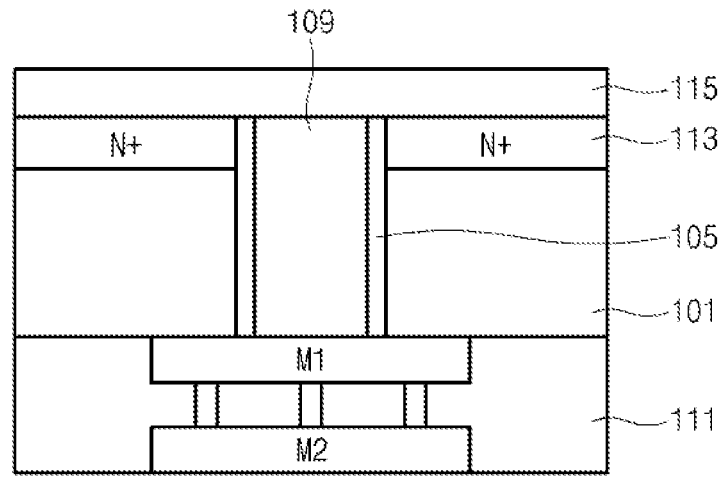

Referring to FIG. 2i, an insulating material 115 is formed over the N-type ion-implanting region 113 and the through silicon via 109. The insulating material 115 may include an oxide film or a nitride film. More specifically, the insulating material 115 may include one selected from a high density plasma (HDP) oxide film, a boron phosphorus silicate glass (BPSG) film, a phosphorus silicate glass (PSG) film, a boron silicate glass (BSG) film, a tetra ethyl ortho silicate (TEOS) film, an un-doped silicon glass (USG) film, a fluorinate silicate glass (FSG) film, a carbon doped oxide (CDO) film, a spin on glass (SOG) film, a spin on dielectric (SOD) film, a plasma enhanced tetra ethyl ortho silicate (PE-TEOS) film, a silicon rich oxide (SROx) film, and an organo silicate glass (OSG) film, or insulating material 115 may include a stacking film having two or more layers thereof.

Figure 2J:
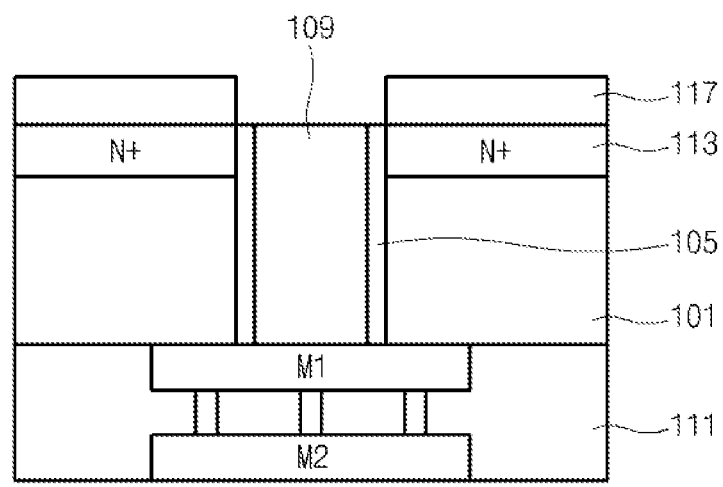

Referring to FIG. 2j, a photoresist pattern is formed over the insulating material 115, and the insulating material 115 disposed over the through silicon via 109 is etched to expose the through silicon via 109 with the photoresist pattern as a mask, thereby obtaining an insulating film 117 pattern.

Figure 2K:
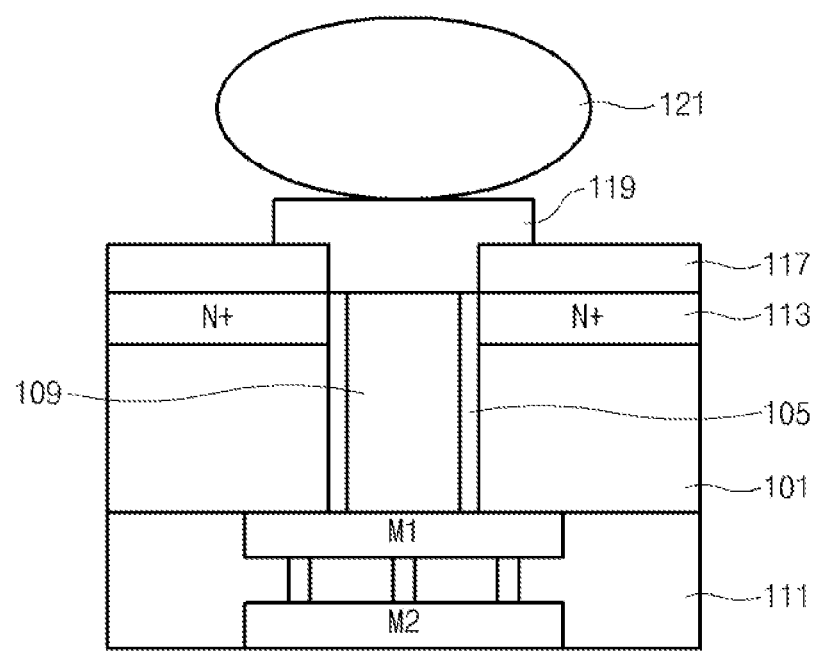

Referring to FIG. 2k, a conductive material is stacked over the exposed through silicon via 109 and patterned to form the bump 119. A ball 121 is formed over the bump 119. The bump 119 is patterned to be connected with the through silicon via 109, and may include a shoulder portion formed over the insulating film 117. The through silicon via 109, the bump 119 and the ball 121 may be electrically coupled to form an electrical path.

As mentioned above, in the semiconductor device of FIG. 1, the N-type ion-implanting region 113 is formed over the semiconductor substrate 101 so that the interface between N-type ion-implanting region 113 and the P-type semiconductor substrate 101 is a PN junction.

As a result, when the bump 119 is connected with the semiconductor substrate 101 by misalignment, a reverse bias applied to P-type substrate 101 prevents current from flowing from the N-type ion-implanting region 113 to the P-type semiconductor substrate 101, thereby preventing an electric short phenomenon between the bump 119 and the semiconductor substrate 101.

In an embodiment in which the through silicon via 109 includes copper (Cu), copper ions of the through silicon via 109 can be prevented from migrating to the semiconductor substrate 101 through the misaligned bump 119.

The semiconductor device of FIG. 1 can be used in an embodiment in which a positive (+) back bias voltage (VBB) is applied to the semiconductor substrate 101. However, because current may flow from the N-type ion-implanting region 113 to the P-type semiconductor substrate 101 when a negative (−) back bias voltage (VBB) is applied to the semiconductor substrate 101, a short may occur between the bump 119 and the semiconductor substrate 101.

Figure 3:
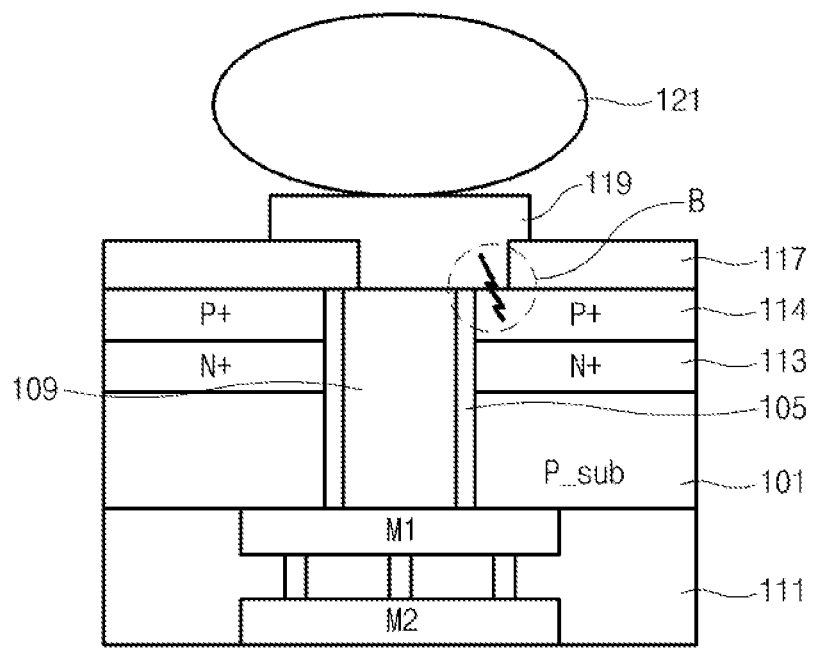
FIG. 3 illustrates a cross-sectional view of a semiconductor device according to an embodiment of the present invention.

Thus, in the embodiment shown in FIG. 3, a P-type ion-implanting region 114 may be additionally formed over the N-type ion-implanting region 113 of the semiconductor device of FIG. 1.

That is, in an embodiment, the N-type ion-implanting region 113 and the P-type ion-implanting region 114 are sequentially formed over the P-type semiconductor substrate 101 which includes the through silicon via 109, thereby forming a PNP type diode.

Referring to FIG. 3, even when the bump 119 is misaligned to be connected with the P-type ion-implanting region 114 (as shown by "B" of FIG. 3), a current does not flow from the P-type ion-implanting region 114 to the N-type ion-implanting region 113 when a negative (−) back bias voltage (VBB) is applied to the semiconductor substrate 101, thereby preventing the leakage current from flowing from the bump 119 to the semiconductor substrate 101.

However, if a reverse voltage reaches a threshold level in the PNP diode structure, more flowing of the current cannot be prevented so that a reverse current comes to flow. The threshold level of the reverse voltage may be referred to as the breakdown voltage. Such breakdown voltage is generally −4V, but a negative back bias voltage (VBB) voltage generally applied to the semiconductor substrate is −0.8V, so that the PNP diode does not fail due to a voltage exceeding the breakdown voltage.

FIGS. 4a to 4e illustrate cross-sectional views of the semiconductor device of FIG. 3.

In an embodiment, the N-type ion-implanting region 113 may be formed as discussed above with respect to FIGS. 2a to 2h.

Figure 4A:
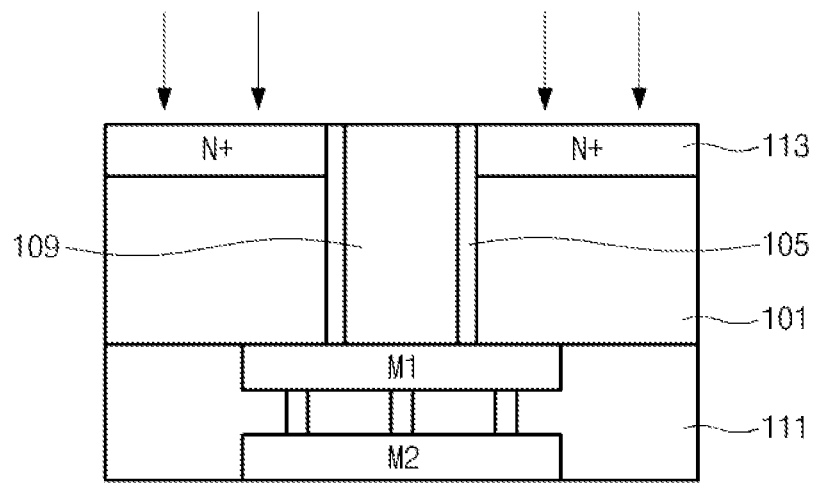
FIGS. 4a to 4e illustrate cross-sectional view of a method for fabricating the semiconductor device of FIG. 3.
Figure 4B:
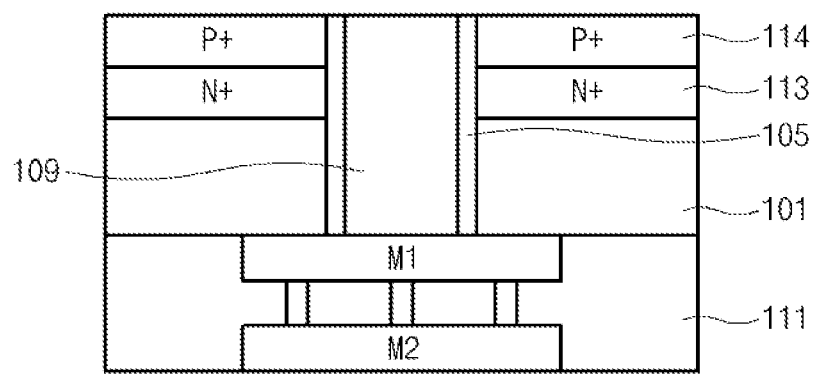

In an embodiment, after the N-type ion-implanting region 113 is formed as shown in FIG. 4a, the P-type ion-implanting region 114 is formed over the N-type ion-implanting region 113 as shown in FIG. 4b.

The P-type ion-implanting region 114 may be formed by implanting P-type impurities into the upper portion of the N-type ion-implanting region 113, or by stacking or attaching a P-type ion-implanting layer implanted with P-type impurities onto the upper portion of the N-type ion-implanting region 113. Persons of skill in the art will recognize that various methods are available for forming the PNP structure of layers 114, 113, and 101, and such methods may be employed in various embodiments.

Referring to FIG. 4b, the N-type ion-implanting region 113 and the P-type ion-implanting region 114 are sequentially stacked over the semiconductor substrate 101 and disposed on both sides of the through silicon via 109.

Figure 4C:
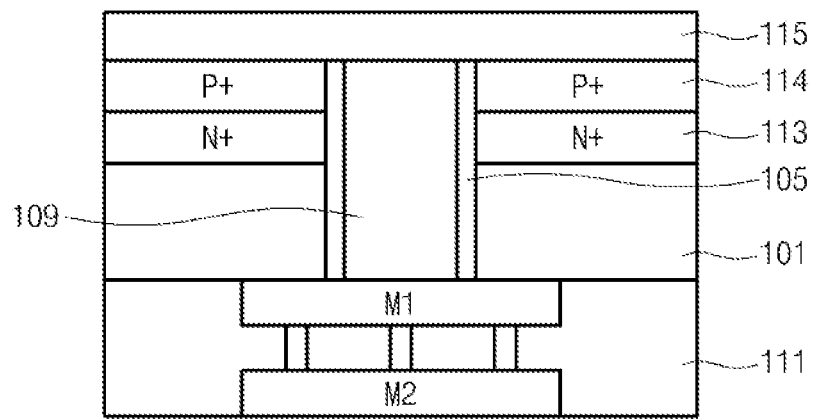
Figure 4D:
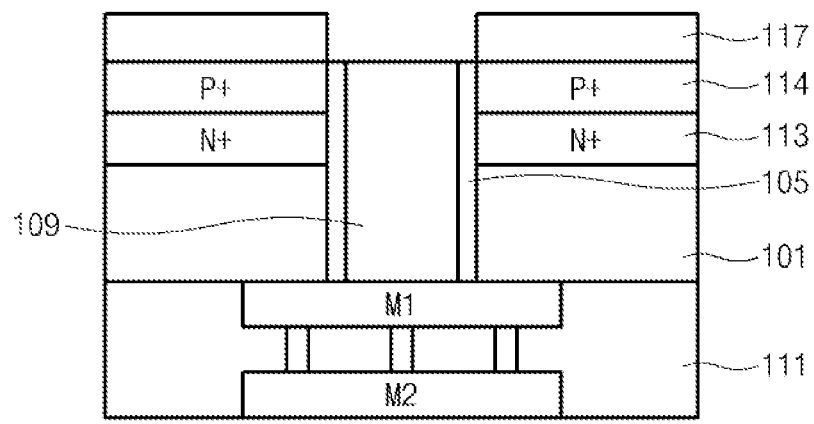

Referring to FIG. 4c, an insulating material 115 is formed over the through silicon via 109 and the P-type ion-implanting region 114. As shown in FIG. 4d, the insulating material 115 is etched with a photoresist pattern (not shown) as a mask to expose the upper portion of the through silicon via 109.

Figure 4E:
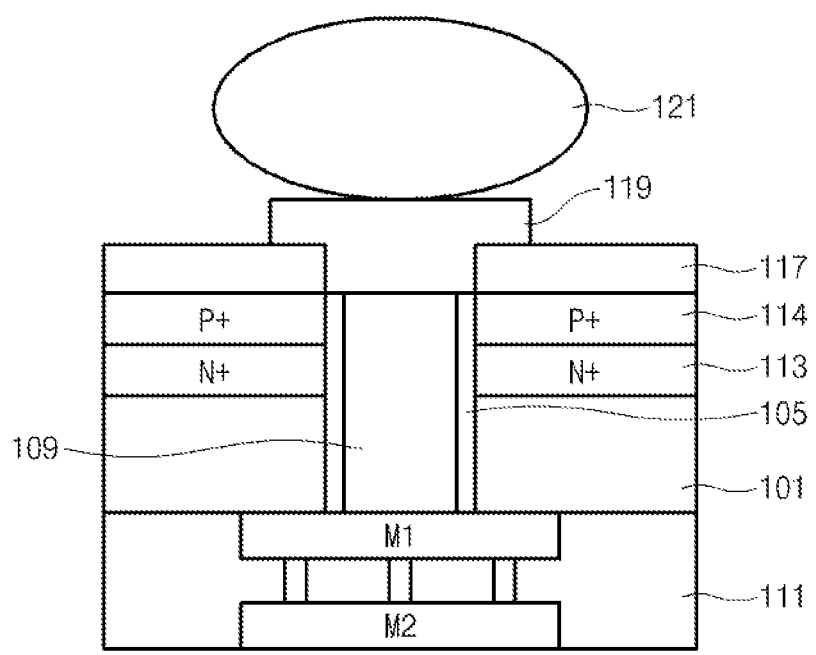

Referring to FIG. 4e, after a conductive material is formed over the exposed through silicon via 109, the bump 119 is formed, for example by a masking and etching process, and the ball 121 is formed over the bump 119. The bump 119 is patterned to be connected with the through silicon via 109 and may include shoulder portions extending over one or more sides of the upper portion of the insulating film 117. The through silicon via 109, the bump 119 and the ball 121 may be electrically connected to one another to form an electrical path.

In the semiconductor device of FIG. 3, the upper portion of the N-type ion-implanting region 113, layers 101, 113, and 114 form a PNP diode adjacent to through silicon via 109. As a result, even when a negative (−) back bias voltage (VBB) is applied to substrate 101 which is doped with P-type ions, leakage current is prevented from flowing from the bump 119 to the semiconductor substrate 101.

Because the semiconductor device of FIG. 3 has a PNP diode type, phenomenon short between the bump 119 and the semiconductor substrate 101 can be prevented regardless of the polarity of the back bias voltage (VBB) applied to the semiconductor substrate 101. Thus, the upper portion of an embodiment can be formed with a PNP diode type.

In an embodiment, since the short between a misaligned bump 119 and the semiconductor substrate 101 can be prevented, the size of the bump 119 can be increased to improve a connection margin with the ball 121. In an embodiment, the size of the opening in insulating film 117 in which the bump 119 is formed may be wider than the through silicon via 109 to enhance the connection margin.

The semiconductor device of FIG. 1 may be used when a positive (+) back bias voltage (VBB) is applied to the semiconductor substrate 101, and the semiconductor device of FIG. 3 may be used when the negative (−) back bias voltage (VBB) is applied to the semiconductor substrate 101. That is, a semiconductor device can be manufactured to have a PN junction or a PNP diode type depending on the bias and level of a VBB voltage applied to the semiconductor substrate 101.

In embodiments of the present invention, the semiconductor substrate is etched to form the vertical hole, the through silicon via is formed, the metal line formed, and the bump is formed over the rear surface of the semiconductor substrate including the through silicon via. However, embodiments for forming the through silicon via are not limited in the examples shown in FIGS. 2a to 4e. The through silicon via (TSV) may include a via last TSV scheme, a via middle TSV scheme, etc. In embodiments of the present invention, after one or more of various types of through silicon via are formed, an ion-implanting process is performed with N-type or P-type impurities.

In a subsequent process (not shown), the semiconductor substrate may be cut along a scribe lane to individualize semiconductor chips, and the individualized semiconductor chips are stacked and electrically connected through the through silicon vias, thereby forming a stacked chip package.

As described above, embodiments of the present invention may provide one or more of the following benefits.

First, when a misalignment occurs during the process for forming a bump, the PN junction is formed in the semiconductor to prevent a short between the bump and the silicon of the semiconductor substrate.

Second, embodiments of the present invention may prevent copper ions in the silicon via from migrating to the semiconductor substrate, thereby improving the semiconductor yield.

Third, since the size of a bump for connecting a ball can be increased because the size of a corresponding opening in an insulating layer where a bump is formed can be enlarged without creating a short, the present invention can improve a connection margin between the ball and the bump.

The above embodiments of the present invention are illustrative and not limitative. Various alternatives and equivalents are possible. The invention is not limited by the embodiments described herein. Nor is the invention limited to any specific type of semiconductor device. Other additions, subtractions, or modifications are obvious in view of the present disclosure and are intended to fall within the scope of the appended claims.

What is claimed is:

1. A semiconductor device, comprising:
   a semiconductor substrate having a first conductivity;
   a plurality of metal lines disposed on a first side of the semiconductor substrate;
   a through silicon via penetrating the semiconductor substrate;
   a first doped layer disposed in a second side of the semiconductor substrate, the first doped layer having a second conductivity by implanted ions;
   a second doped layer disposed on the first doped layer and having the first conductivity; and
   a bump disposed on the second side of the semiconductor substrate and coupled to the through silicon via.

2. The semiconductor device according to claim 1, wherein the first doped layer includes a different type and concentration of impurities from the semiconductor substrate.

3. The semiconductor device according to claim 1, wherein the substrate includes P-type impurities and the first doped layer includes N-type impurities.

4. The semiconductor device according to claim 1, wherein a width of the bump is larger than a width of the through silicon via.

5. The semiconductor device according to claim 1, wherein the substrate and the second doped layer include P-type impurities and the first doped layer includes N-type impurities.

6. The semiconductor device according to claim 1, wherein the bump is formed on the second doped layer.

7. The semiconductor device according to claim 1, further comprising an insulating film formed on the second doped layer.

* * * * *